(12) United States Patent
Uesugi et al.

(10) Patent No.: US 7,782,576 B2
(45) Date of Patent: Aug. 24, 2010

(54) EXCHANGE-COUPLING FILM INCORPORATING STACKED ANTIFERROMAGNETIC LAYER AND PINNED LAYER, AND MAGNETORESISTIVE ELEMENT INCLUDING THE EXCHANGE-COUPLING FILM

(75) Inventors: Takumi Uesugi, Tokyo (JP); Satoshi Miura, Tokyo (JP)

(73) Assignee: TDK Corporation, Tokyo (JP)

( * ) Notice: Subject to any disclaimer, the term of this patent is extended or adjusted under 35 U.S.C. 154(b) by 750 days.

(21) Appl. No.: 11/806,823

(22) Filed: Jun. 4, 2007

(65) Prior Publication Data
US 2008/0037184 A1    Feb. 14, 2008

(30) Foreign Application Priority Data
Aug. 10, 2006    (JP)    ............... 2006-217638

(51) Int. Cl.
*G11B 5/33*    (2006.01)
(52) U.S. Cl. ................................. 360/324.11
(58) Field of Classification Search ............ 360/324.11
See application file for complete search history.

(56) References Cited

U.S. PATENT DOCUMENTS

| | | | | |
|---|---|---|---|---|
| 6,353,518 B2 * | 3/2002 | Pinarbasi | ............... | 360/324.11 |
| 6,356,419 B1 * | 3/2002 | Gill | ............... | 360/324.11 |
| 6,580,588 B1 * | 6/2003 | Gill | ............... | 360/324.1 |
| 6,580,589 B1 * | 6/2003 | Gill | ............... | 360/324.11 |
| 7,029,770 B2 | 4/2006 | Shimazawa et al. | | |
| 7,071,522 B2 | 7/2006 | Yuasa et al. | | |
| 2006/0044708 A1 * | 3/2006 | Gill | ............... | 360/324.12 |
| 2006/0203397 A1 | 9/2006 | Mizuno et al. | | |

FOREIGN PATENT DOCUMENTS

| JP | A 2003-60263 | 2/2003 |
|---|---|---|
| JP | A-2003-124541 | 4/2003 |
| JP | A 2004-103806 | 4/2004 |
| JP | A-2006-080144 | 3/2006 |

* cited by examiner

*Primary Examiner*—David D Davis
(74) *Attorney, Agent, or Firm*—Oliff & Berridge, PLC (57) ABSTRACT

An exchange-coupling film incorporates an antiferromagnetic layer and a pinned layer. The pinned layer includes a first ferromagnetic layer, a second ferromagnetic layer, a third ferromagnetic layer, a nonmagnetic middle layer, and a fourth ferromagnetic layer that are disposed in this order, the first ferromagnetic layer being closest to the antiferromagnetic layer. The first ferromagnetic layer is made of a ferromagnetic material and has a face-centered cubic structure. The second ferromagnetic layer is made of only iron or an alloy containing x atomic % cobalt and (100−x) atomic % iron, wherein x is greater than zero and smaller than or equal to 60. The third ferromagnetic layer is made of an alloy containing y atomic % cobalt and (100−y) atomic % iron, wherein y is within a range of 65 to 80 inclusive. The antiferromagnetic layer and the first ferromagnetic layer are exchange-coupled to each other. The third and fourth ferromagnetic layers are antiferromagnetically coupled to each other.

8 Claims, 7 Drawing Sheets

EXCHANGE-COUPLING FILM INCORPORATING STACKED ANTIFERROMAGNETIC LAYER AND PINNED LAYER, AND MAGNETORESISTIVE ELEMENT INCLUDING THE EXCHANGE-COUPLING FILM

BACKGROUND OF THE INVENTION

1. Field of the Invention

The present invention relates to an exchange-coupling film incorporating an antiferromagnetic layer and a pinned layer that are stacked, and to a magnetoresistive element, a thin-film magnetic head, a head gimbal assembly, a head arm assembly and a magnetic disk drive each of which incorporates the exchange-coupling film.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write (recording) head having an induction-type electromagnetic transducer for writing and a read (reproducing) head having a magnetoresistive (MR) element for reading are stacked on a substrate.

MR elements include giant magnetoresistive (GMR) elements utilizing a giant magnetoresistive effect, and tunneling magnetoresistive (TMR) elements utilizing a tunnel magnetoresistive effect.

It is required that the characteristics of a read head include high sensitivity and high output capability. GMR heads incorporating spin-valve GMR elements have been mass-produced as read heads that satisfy such requirements. Recently, developments of read heads using TMR elements have been pursued to adapt to further improvements in areal recording density.

Typically, a spin-valve GMR element incorporates: a nonmagnetic conductive layer having two surfaces facing toward opposite directions; a free layer disposed adjacent to one of the two surfaces of the nonmagnetic conductive layer; a pinned layer disposed adjacent to the other one of the two surfaces of the nonmagnetic conductive layer; and an antiferromagnetic layer disposed adjacent to a surface of the pinned layer farther from the nonmagnetic conductive layer. The free layer is a ferromagnetic layer in which the direction of magnetization changes in response to a signal magnetic field. The pinned layer is a ferromagnetic layer in which the direction of magnetization is fixed. The antiferromagnetic layer is a layer that fixes the direction of magnetization of the pinned layer by means of exchange coupling with the pinned layer.

Conventional GMR heads have a structure in which a current used for detecting magnetic signals (that is hereinafter called a sense current) is fed in the direction parallel to the plane of each layer making up the GMR element. Such a structure is called a current-in-plane (CIP) structure. On the other hand, developments have been pursued for another type of GMR heads having a structure in which the sense current is fed in a direction intersecting the plane of each layer making up the GMR element, such as the direction perpendicular to the plane of each layer making up the GMR element. Such a structure is called a current-perpendicular-to-plane (CPP) structure. A GMR element used for read heads having the CPP structure is hereinafter called a CPP-GMR element. A GMR element used for read heads having the CIP structure is hereinafter called a CIP-GMR element.

A read head incorporating the TMR element mentioned previously has the CPP structure, too. Typically, the TMR element incorporates: a tunnel barrier layer having two surfaces facing toward opposite directions; a free layer disposed adjacent to one of the two surfaces of the tunnel barrier layer; a pinned layer disposed adjacent to the other one of the two surfaces of the tunnel barrier layer; and an antiferromagnetic layer disposed adjacent to a surface of the pinned layer farther from the tunnel barrier layer. The tunnel barrier layer is a nonmagnetic insulating layer that allows electrons to pass therethrough while the electrons maintain spins by means of the tunnel effect. The free layer, the pinned layer and the antiferromagnetic layer are the same as those of the spin-valve GMR element.

As a type of pinned layer of an MR element, there is known a pinned layer having a structure in which a nonmagnetic middle layer is sandwiched between two ferromagnetic layers that are antiferromagnetically coupled to each other, as disclosed in JP 2004-103806A, for example. Such a structure is called a synthetic structure, for example, and the pinned layer having this structure is called a synthetic pinned layer, for example. The synthetic pinned layer makes it possible to increase an exchange-coupling magnetic field of the pinned layer.

JP 2004-103806A discloses an exchange-coupling film in which an antiferromagnetic layer and a ferromagnetic layer sandwich are stacked and the direction of magnetization of the ferromagnetic layer sandwich is fixed. The ferromagnetic layer sandwich includes: a first ferromagnetic layer containing a ferromagnetic material having a body-centered cubic structure; and a pair of second ferromagnetic layers respectively formed on both surfaces of the first ferromagnetic layer and containing a ferromagnetic material having a face-centered cubic structure. The antiferromagnetic layer includes a random alloy and touches one of the second ferromagnetic layers. JP 2004-103806A discloses that the exchange-coupling film having such a structure allows the emergence of sufficient exchange-coupling energy even if the antiferromagnetic layer is thin. Furthermore, this publication discloses that a synthetic structure may be formed by providing a third ferromagnetic layer on a side of the other of the second ferromagnetic layers farther from the antiferromagnetic layer, with a nonmagnetic intermediate layer provided between the third ferromagnetic layer and the other one of the second ferromagnetic layers.

Furthermore, as examples of the material of the first ferromagnetic layer, this publication discloses Fe, an FeTa alloy containing 95% iron, an FeCo alloy containing 90% iron, and an FeCo alloy containing 50% iron. As examples of the material of the second ferromagnetic layers, this publication discloses Co, a CoFe alloy containing 90% cobalt, and an NiFe alloy containing 80% nickel.

JP 2003-060263A discloses a pinned layer having a structure in which a layer made of an FeCo alloy containing 50 atomic % iron is inserted between two layers each of which is made of a CoFe alloy containing 90 atomic % cobalt.

In the synthetic pinned layer mentioned previously, one of the ferromagnetic layers is disposed between the antiferromagnetic layer and the nonmagnetic middle layer, forms exchange coupling with the antiferromagnetic layer, and is antiferromagnetically coupled to the other one of the ferromagnetic layers. Therefore, to increase the exchange-coupling magnetic field of the synthetic pinned layer, it is important to enhance both the exchange coupling between the one of the ferromagnetic layers and the antiferromagnetic layer, and the antiferromagnetic coupling between the two ferromagnetic layers.

In JP 2004-103806A, although consideration is given to enhancing the exchange coupling between the antiferromagnetic layer and the layered structure of ferromagnetic layers, no consideration is given to enhancing the antiferromagnetic coupling between the second ferromagnetic layer and the third ferromagnetic layer that are the two ferromagnetic layers antiferromagnetically coupled to each other in the synthetic structure.

In JP 2003-060263A, no consideration is given to increasing the exchange-coupling magnetic field of the synthetic pinned layer.

OBJECT AND SUMMARY OF THE INVENTION

It is an object of the invention to provide an exchange-coupling film incorporating an antiferromagnetic layer and a pinned layer that are stacked, the pinned layer having a synthetic structure, the exchange-coupling film being capable of increasing an exchanging-coupling magnetic field of the pinned layer, and to a magnetoresistive element, a thin-film magnetic head, a head gimbal assembly, a head arm assembly and a magnetic disk drive each of which incorporates the exchange-coupling film.

An exchange-coupling film of the invention incorporates an antiferromagnetic layer and a pinned layer that are stacked, the pinned layer having a fixed direction of magnetization. The pinned layer includes a first ferromagnetic layer, a second ferromagnetic layer, a third ferromagnetic layer, a nonmagnetic middle layer, and a fourth ferromagnetic layer that are disposed in this order, the first ferromagnetic layer being closest to the antiferromagnetic layer. The first ferromagnetic layer is made of a ferromagnetic material and has a face-centered cubic structure. The second ferromagnetic layer is made of only iron or an alloy containing x atomic % cobalt and (100−x) atomic % iron, wherein x is greater than zero and smaller than or equal to 60. The third ferromagnetic layer is made of an alloy containing y atomic % cobalt and (100−y) atomic % iron, wherein y is within a range of 65 to 80 inclusive. The nonmagnetic middle layer is made of a nonmagnetic material. The fourth ferromagnetic layer is made of a ferromagnetic material. The antiferromagnetic layer and the first ferromagnetic layer are exchange-coupled to each other. The third and fourth ferromagnetic layers are antiferromagnetically coupled to each other.

According to the exchange-coupling film of the invention, both the exchange coupling between the antiferromagnetic layer and the first ferromagnetic layer and the antiferromagnetic coupling between the third and fourth ferromagnetic layers are enhanced, and as a result, the exchange-coupling magnetic field of the pinned layer is increased.

In the exchange-coupling film of the invention, the second ferromagnetic layer may have a body-centered cubic structure.

In the exchange-coupling film of the invention, the second ferromagnetic layer may be made of an alloy containing x atomic % cobalt and (100−x) atomic % iron, wherein x is within a range of 30 to 60 inclusive.

A magnetoresistive element of the invention incorporates: the exchange-coupling film of the invention; a spacer layer made of a nonmagnetic material and disposed at such a position that the pinned layer is sandwiched between the spacer layer and the antiferromagnetic layer; and a free layer disposed at such a position that the spacer layer is sandwiched between the free layer and the pinned layer, the free layer having a direction of magnetization that changes in response to an external magnetic field.

A thin-film magnetic head of the invention incorporates: a medium facing surface that faces toward a recording medium; and the magnetoresistive element of the invention disposed near the medium facing surface for detecting a signal magnetic field sent from the recording medium.

A head gimbal assembly of the invention incorporates: a slider including the thin-film magnetic head of the invention and disposed to face toward a recording medium; and a suspension flexibly supporting the slider. A head arm assembly of the invention incorporates: a slider including the thin-film magnetic head of the invention and disposed to face toward a recording medium; a suspension flexibly supporting the slider; and an arm for making the slider travel across tracks of the recording medium, the suspension being attached to the arm.

A magnetic disk drive of the invention incorporates: a slider including the thin-film magnetic head of the invention and disposed to face toward a recording medium that is driven to rotate; and an alignment device supporting the slider and aligning the slider with respect to the recording medium.

According to the invention, it is possible to enhance both the exchange coupling between the antiferromagnetic layer and the first ferromagnetic layer and the antiferromagnetic coupling between the third and fourth ferromagnetic layers. As a result, it is possible to increase the exchange-coupling magnetic field of the pinned layer.

Other and further objects, features and advantages of the invention will appear more fully from the following description.

DETAILED DESCRIPTION OF THE PREFERRED EMBODIMENTS

First Embodiment

Figure 2:
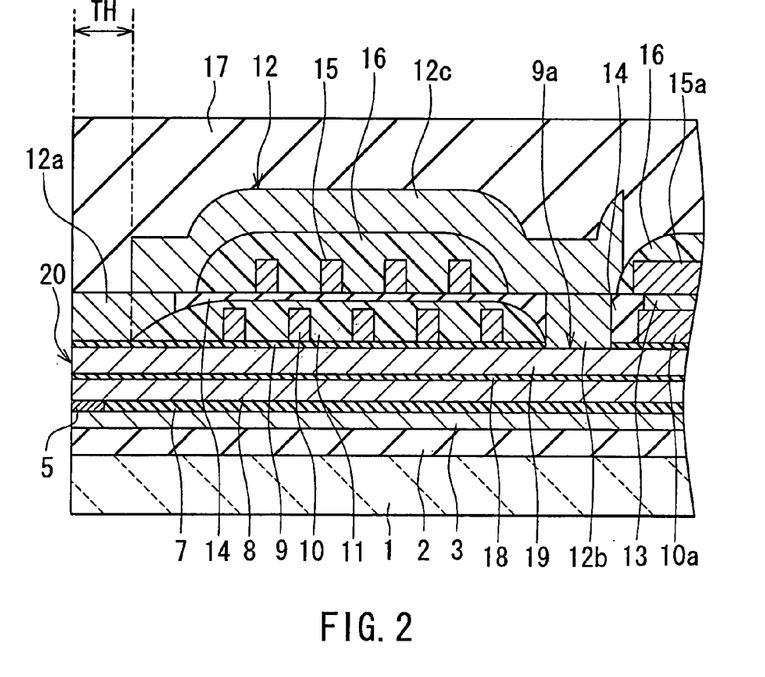
FIG. 2 is a cross-sectional view illustrating a cross section of a thin-film magnetic head of the first embodiment of the invention, the cross section being orthogonal to the medium facing surface and a substrate.
Figure 3:
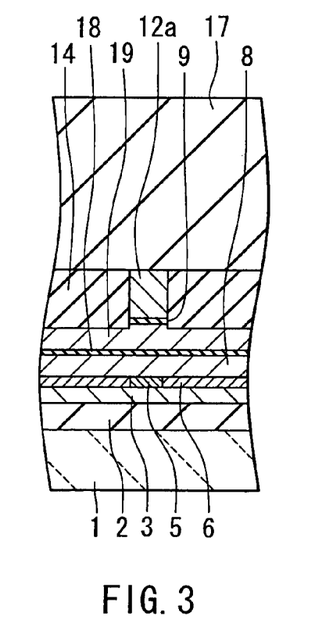
FIG. 3 is a cross-sectional view illustrating a cross section of a pole portion of the thin-film magnetic head of the first embodiment of the invention, the cross section being parallel to the medium facing surface.

Preferred embodiments of the invention will now be described in detail with reference to the accompanying drawings. Reference is now made to FIG. 2 and FIG. 3 to describe outlines of the configuration and manufacturing method of a thin-film magnetic head of a first embodiment of the invention. FIG. 2 is a cross-sectional view illustrating a cross section of the thin-film magnetic head orthogonal to a medium facing surface and a substrate. FIG. 3 is a cross-sectional view illustrating a cross section of a pole portion of the thin-film magnetic head parallel to the medium facing surface.

The thin-film magnetic head of the embodiment has a medium facing surface 20 that faces toward a recording medium. The thin-film magnetic head incorporates: a substrate 1 made of a ceramic such as aluminum oxide and titanium carbide ($Al_2O_3$—TiC); an insulating layer 2 made of an insulating material such as alumina ($Al_2O_3$) and disposed on the substrate 1; a first shield layer 3 made of a magnetic material and disposed on the insulating layer 2; an MR element 5 disposed on the first shield layer 3; two bias field applying layers 6 disposed adjacent to the two sides of the MR element 5; and an insulating layer 7 disposed around the MR element 5 and the bias field applying layers 6. The MR element 5 is disposed near the medium facing surface 20. The insulating layer 7 is made of an insulating material such as alumina.

The thin-film magnetic head further incorporates: a second shield layer 8 made of a magnetic material and disposed on the MR element 5, the bias field applying layers 6 and the insulating layer 7; a separating layer 18 made of a nonmagnetic material such as alumina and disposed on the second shield layer 8; and a bottom pole layer 19 made of a magnetic material and disposed on the separating layer 18. The magnetic material used for the second shield layer 8 and the bottom pole layer 19 is a soft magnetic material such as NiFe, CoFe, CoFeNi or FeN. Alternatively, a second shield layer that also functions as a bottom pole layer may be provided in place of the second shield layer 8, the separating layer 18 and the bottom pole layer 19.

The thin-film magnetic head further incorporates a write gap layer 9 made of a nonmagnetic material such as alumina and disposed on the bottom pole layer 19. The write gap layer 9 has a contact hole 9a formed in a region away from the medium facing surface 20.

The thin-film magnetic head further incorporates a first layer portion 10 of a thin-film coil disposed on the write gap layer 9. The first layer portion 10 is made of a conductive material such as copper (Cu). In FIG. 2 numeral 10a indicates a connecting portion of the first layer portion 10 connected to a second layer portion 15 of the thin-film coil described later. The first layer portion 10 is wound around the contact hole 9a.

The thin-film magnetic head further incorporates: an insulating layer 11 made of an insulating material and disposed to cover the first layer portion 10 of the thin-film coil and the write gap layer 9 disposed around the first layer portion 10; a top pole layer 12 made of a magnetic material; and a connecting layer 13 made of a conductive material and disposed on the connecting portion 10a. The connecting layer 13 may be made of a magnetic material. Each of the outer and inner edge portions of the insulating layer 11 has a shape of rounded oblique surface.

The top pole layer 12 has a track width defining layer 12a, a coupling portion layer 12b and a yoke portion layer 12c. The track width defining layer 12a is disposed on regions of the write gap layer 9 and the insulating layer 11, the regions extending from an oblique portion of the insulating layer 11 closer to the medium facing surface 20 toward the medium facing surface 20. The track width defining layer 12a has: a front-end portion that is formed on the write gap layer 9 and functions as the pole portion of the top pole layer 12; and a connecting portion that is formed on the oblique portion of the insulating layer 11 closer to the medium facing surface 20 and is connected to the yoke portion layer 12c. The front-end portion has a width equal to the write track width. The connecting portion has a width greater than that of the front-end portion.

The coupling portion layer 12b is disposed on a region of the bottom pole layer 19 where the contact hole 9a is formed. The yoke portion layer 12c couples the track width defining layer 12a and the coupling portion layer 12b to each other. An end of the yoke portion layer 12c closer to the medium facing surface 20 is located at a distance from the medium facing surface 20. The yoke portion layer 12c is connected to the bottom pole layer 19 through the coupling portion layer 12b.

The thin-film magnetic head further incorporates an insulating layer 14 made of an inorganic insulating material such as alumina and disposed around the coupling portion layer 12b. The track width defining layer 12a, the coupling portion layer 12b, the connecting layer 13 and the insulating layer 14 have flattened top surfaces.

The thin-film magnetic head further incorporates the second layer portion 15 of the thin-film coil disposed on the insulating layer 14. The second layer portion 15 is made of a conductive material such as copper (Cu). In FIG. 2 numeral 15a indicates a connecting portion of the second layer portion 15 connected to the connecting portion 10a of the first layer portion 10 of the thin-film coil through the connecting layer 13. The second layer portion 15 is wound around the coupling portion layer 12b.

The thin-film magnetic head further incorporates an insulating layer 16 disposed to cover the second layer portion 15 of the thin-film coil and the insulating layer 14 around the second layer portion 15. Outer and inner edge portions of the insulating layer 16 each have a shape of a rounded oblique surface. A portion of the yoke portion layer 12c is located on the insulating layer 16.

The thin-film magnetic head further incorporates an overcoat layer 17 disposed to cover the top pole layer 12. The overcoat layer 17 is made of alumina, for example.

The outline of the method of manufacturing the thin-film magnetic head of the embodiment will now be described. In the method, first, the insulating layer 2 is formed to have a thickness of 0.2 to 5 μm, for example, on the substrate 1 by a method such as sputtering. Next, the first shield layer 3 is formed into a predetermined pattern on the insulating layer 2 by a method such as plating. Next, although not shown, an insulating layer of alumina, for example, is formed over the entire surface. Next, the insulating layer is polished by chemical mechanical polishing (CMP), for example, so that the first shield layer 3 is exposed, and the top surfaces of the first shield layer 3 and the insulating layer are thereby flattened.

Next, the MR element 5, the two bias field applying layers 6, and the insulating layer 7 are formed on the first shield layer 3. Next, the second shield layer 8 is formed on the MR element 5, the bias field applying layers 6 and the insulating layer 7. The second shield layer 8 is formed by plating or sputtering, for example. Next, the separating layer 18 is formed by sputtering, for example, on the second shield layer 8. Next, the bottom pole layer 19 is formed on the separating layer 18 by plating or sputtering, for example.

Next, the write gap layer 9 is formed to have a thickness of 50 to 300 nm, for example, on the bottom pole layer 19 by a method such as sputtering. Next, to make a magnetic path, a portion of the write gap layer 9 is etched to form the contact hole 9a in a center portion of the thin-film coil that will be formed later.

Next, the first layer portion 10 of the thin-film coil is formed to have a thickness of 2 to 3 μm, for example, on the write gap layer 9. The first layer portion 10 is wound around the contact hole 9a.

Next, the insulating layer 11 is formed into a predetermined pattern to cover the first layer portion 10 of the thin-film coil and the write gap layer 9 disposed around the first layer portion 10. The insulating layer 11 is made of an organic insulating material that exhibits fluidity when heated, such as photoresist. Next, heat treatment is performed at a specific temperature to flatten the surface of the insulating layer 11. Through this heat treatment, each of the outer and inner edge portions of the insulating layer 11 is made to have a shape of rounded oblique surface.

Next, the track width defining layer 12a of the top pole layer 12 is formed on regions of the write gap layer 9 and the insulating layer 11, the regions extending from the oblique portion of the insulating layer 11 closer to the medium facing surface 20 described later toward the medium facing surface 20.

When the track width defining layer 12a is formed, the coupling portion layer 12b is formed on the region of the bottom pole layer 19 where the contact hole 9a is formed, and the connecting layer 13 is formed on the connecting portion 10a at the same time.

Next, pole trimming is performed. That is, in a region around the track width defining layer 12a, the write gap layer 9 and at least a portion of the pole portion of the bottom pole layer 19 close to the write gap layer 9 are etched using the track width defining layer 12a as a mask. As a result, as shown in FIG. 3, a trim structure is formed, wherein the pole portion of the top pole layer 12, the write gap layer 9 and at least a portion of the pole portion of the bottom pole layer 19 have equal widths. The trim structure prevents an increase in effective track width resulting from an expansion of magnetic flux near the write gap layer 9.

Next, the insulating layer 14 is formed to have a thickness of 3 to 4 μm, for example, over the entire top surface of the layered structure formed through the foregoing steps. The insulating layer 14 is then polished by CMP, for example, to reach the surfaces of the track width defining layer 12a, the coupling portion layer 12b and the connecting layer 13, and is flattened.

Next, the second layer portion 15 of the thin-film coil is formed to have a thickness of 2 to 3 μm, for example, on the flattened insulating layer 14. The second layer portion 15 is wound around the coupling portion layer 12b.

Next, the insulating layer 16 is formed into a specific pattern to cover the second layer portion 15 of the thin-film coil and the insulating layer 14 disposed around the second layer portion 15. The insulating layer 16 is made of an organic insulating material that exhibits fluidity when heated, such as photoresist. Next, heat treatment is performed at a specific temperature to flatten the surface of the insulating layer 16. Through this heat treatment, each of the outer and inner edge portions of the insulating layer 16 is made to have a shape of rounded oblique surface. Next, the yoke portion layer 12c is formed on the track width defining layer 12a, the insulating layers 14 and 16, and the coupling portion layer 12b.

Next, the overcoat layer 17 is formed to cover the entire top surface of the layered structure formed through the foregoing steps. Next, wiring and terminals and so on are formed on the overcoat layer 17. Finally, machining of the slider including the foregoing layers is performed to form the medium facing surface 20, and the thin-film magnetic head including a write head and a read head is thus completed.

The thin-film magnetic head thus manufactured has the medium facing surface 20 that faces toward a recording medium, the read head and the write head. The configuration of the read head will be described in detail later.

The write head incorporates the bottom pole layer 19 and the top pole layer 12 that are magnetically coupled to each other and include their respective pole portions that are opposed to each other and placed in regions on a side of the medium facing surface 20. The write head further incorporates: the write gap layer 9 provided between the pole portion of the bottom pole layer 19 and the pole portion of the top pole layer 12; and the thin-film coil including the portions 10 and 15 at least part of which is placed between the bottom pole layer 19 and the top pole layer 12 and insulated from the bottom pole layer 19 and the top pole layer 12. In this thin-film magnetic head, as shown in FIG. 2, the length from the medium facing surface 20 to the end of the insulating layer 11 closer to the medium facing surface 20 corresponds to throat height TH. The throat height refers to the length (height) from the medium facing surface 20 to the point at which the distance between the two pole layers starts to increase. Although the write head shown in FIG. 2 and FIG. 3 is one designed for a longitudinal magnetic recording system, the write head of the embodiment may be one designed for a perpendicular magnetic recording system.

Figure 1:
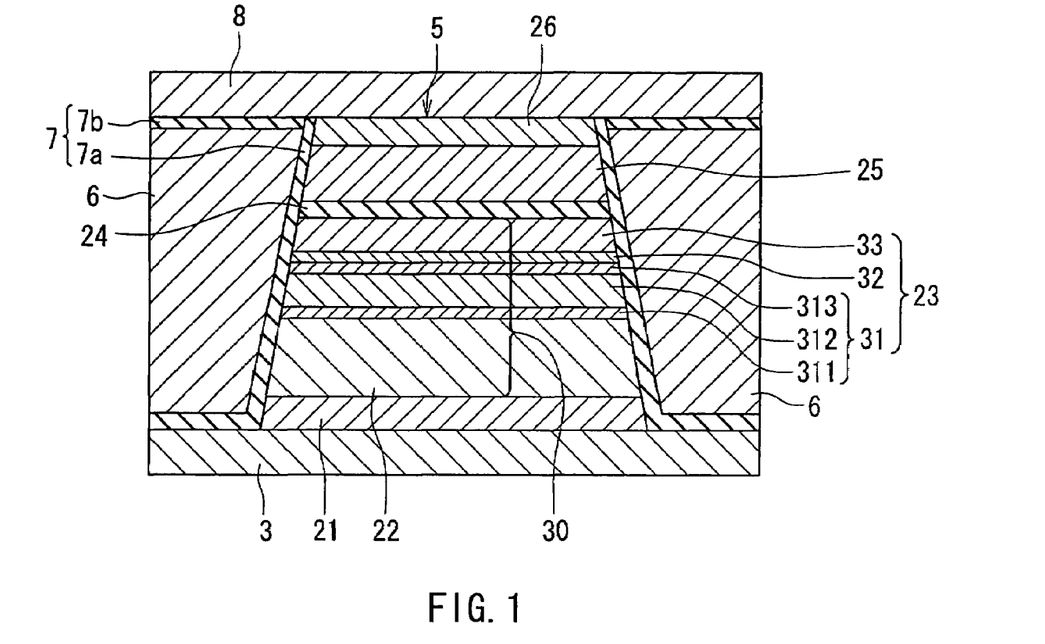
FIG. 1 is a cross-sectional view illustrating a cross section of a read head of a first embodiment of the invention, the cross section being parallel to a medium facing surface.

Reference is now made to FIG. 1 to describe the details of the configuration of the read head of the embodiment. FIG. 1 is a cross-sectional view of the read head parallel to the medium facing surface. The read head of the embodiment incorporates: the first shield layer 3 and the second shield layer 8 disposed at a predetermined distance from each other; the MR element 5 disposed between the first shield layer 3 and the second shield layer 8; the two bias field applying layers 6 that are disposed adjacent to the two sides of the MR element 5 and that apply a bias magnetic field to the MR element 5; and the insulating layer 7 disposed around the MR element 5 and the bias field applying layers 6. The bias field applying layers 6 are each made of a hard magnetic layer (hard magnet) or a layered structure made up of ferromagnetic layers and antiferromagnetic layers, for example. To be specific, the bias field applying layers 6 are made of CoPt or CoCrPt, for example. The insulating layer 7 incorporates insulating films 7a and 7b. The insulating film 7a is placed between the bias field applying layers 6 and each of the first shield layer 3 and the MR element 5, and insulates the bias field applying layers 6 from each of the first shield layer 3 and the MR element 5. The insulating film 7b is placed between the second shield layer 8 and the bias field applying layers 6, and insulates the bias field applying layers 6 from the second shield layer 8. The insulating films 7a and 7b are made of alumina, for example. It is not absolutely necessary to provide the insulating film 7b.

The MR element 5 of the embodiment is a TMR element. To the MR element 5 a sense current that is a current for detecting magnetic signals is fed in a direction intersecting the plane of each layer making up the MR element 5, such as the direction perpendicular to the plane of each layer making up the MR element 5. The first shield layer 3 and the second shield layer 8 also function as a pair of electrodes for feeding a sense current to the MR element 5 in a direction intersecting the plane of each layer making up the MR element 5, such as the direction perpendicular to the plane of each layer making up the MR element 5. In addition to the first shield layer 3 and the second shield layer 8, a pair of electrodes may be respectively provided on top and bottom of the MR element 5. The MR element 5 has a resistance that changes in response to an external magnetic field, that is, a signal magnetic field sent from the recording medium. It is possible to determine the resistance of the MR element 5 from the sense current. In the manner thus described, it is possible to read data stored on the recording medium through the use of the read head.

The MR element 5 incorporates an underlying layer 21, an antiferromagnetic layer 22, a pinned layer 23, a spacer layer 24, a free layer 25 and a protection layer 26 that are stacked in this order on the first shield layer 3. The pinned layer 23 is a ferromagnetic layer having a fixed direction of magnetization. The antiferromagnetic layer 22 is a layer that fixes the direction of magnetization of the pinned layer 23 by exchange coupling with the pinned layer 23. The antiferromagnetic layer 22 and the pinned layer 23 that are stacked constitute the exchange-coupling film 30 of the embodiment. The underlying layer 21 is provided for improving the crystallinity and orientability of each layer formed thereon and particularly for enhancing the exchange coupling between the antiferromagnetic layer 22 and the pinned layer 23. The free layer 25 is a ferromagnetic layer having a direction of magnetization that changes in response to an external magnetic field, that is, a signal magnetic field sent from the recording medium. The protection layer 26 is a layer for protecting the layers therebelow.

In the example shown in FIG. 1, the pinned layer 23 is located closer to the first shield layer 3 than the free layer 25. However, the reverse is possible, that is, the free layer 25 may be located closer to the first shield layer 3.

The underlying layer 21 has a thickness of 2 to 6 nm, for example. The underlying layer 21 is made of a layered structure made up of a Ta layer and an Ru layer, for example.

The antiferromagnetic layer 22 has a thickness of 5 to 30 nm, for example, and is made of an antiferromagnetic material containing Mn and at least one element $M_{II}$ selected from the group consisting of Pt, Ru, Rh, Pd, Ni, Cu, Ir, Cr and Fe, for example. The Mn content preferably falls within a range of 35 to 95 atomic % inclusive. The content of the other element $M_{II}$ preferably falls within a range of 5 to 65 atomic % inclusive. One type of antiferromagnetic material is a non-heat-induced antiferromagnetic material that exhibits antiferromagnetism without any heat treatment and that induces an exchange coupling magnetic field between a ferromagnetic material and itself. Another type of antiferromagnetic material is a heat-induced antiferromagnetic material that exhibits antiferromagnetism when heat treatment is given. The antiferromagnetic layer 22 may be made of either of these types. The non-heat-induced antiferromagnetic materials include an Mn alloy that has a γ phase, such as RuRhMn, FeMn, and IrMn. The heat-induced antiferromagnetic materials include an Mn alloy that has a regular crystal structure, such as PtMn, NiMn, and PtRhMn.

The direction of magnetization is fixed in the pinned layer 23 by means of the exchange coupling at the interface between the antiferromagnetic layer 22 and the pinned layer 23. The pinned layer 23 of the embodiment is a so-called synthetic pinned layer, incorporating an outer layer 31, a nonmagnetic middle layer 32 and an inner layer 33 that are stacked in this order on the antiferromagnetic layer 22. Each of the inner layer 33 and the outer layer 31 is a ferromagnetic layer. The inner layer 33 and the outer layer 31 are antiferromagnetically coupled to each other and the directions of magnetization thereof are fixed to opposite directions. The outer layer 31 has a thickness of 3 to 7 nm, for example. The inner layer 33 has a thickness of 3 to 10 nm, for example.

The outer layer 31 of the embodiment includes a first layer 311, a second layer 312 and a third layer 313 that are stacked in this order on the antiferromagnetic layer 22. Each of the first layer 311, the second layer 312 and the third layer 313 is a ferromagnetic layer made of a ferromagnetic material. The first layer 311, the second layer 312 and the third layer 313 correspond to the first ferromagnetic layer, the second ferromagnetic layer and the third ferromagnetic layer of the invention, respectively.

The inner layer 33 includes a ferromagnetic layer made of a ferromagnetic material containing at least Co selected from the group consisting of Co and Fe. The inner layer 33 corresponds to the fourth ferromagnetic layer of the invention.

The nonmagnetic middle layer 32 has a thickness of 0.35 to 1.0 nm, for example, and is made of a nonmagnetic material containing at least one element selected from the group consisting of Ru, Rh, Ir, Re, Cr, Zr and Cu, for example. The nonmagnetic middle layer 32 is provided for creating antiferromagnetic exchange coupling between the inner layer 33 and the outer layer 31, and for fixing the magnetizations of these layers to opposite directions. The magnetizations of the inner layer 33 and the outer layer 31 in opposite directions include not only the case in which there is a difference of 180 degrees between these directions of magnetizations, but also the case in which there is a difference of 180±20 degrees between them.

The spacer layer 24 is a tunnel barrier layer that allows electrons to pass therethrough while the electrons maintain spins by means of the tunnel effect. The spacer layer 24 has a thickness of 0.5 to 2 nm, for example. The spacer layer 24 is made of an insulating material which may be an oxide or a nitride of Al, Ni, Gd, Mg, Ta, Mo, Ti, W, Hf or Zr, for example.

The free layer 25 has a thickness of 2 to 10 nm, for example. The free layer 25 is formed of a ferromagnetic layer having a low coercivity. The free layer 25 may include a plurality of ferromagnetic layers that are stacked.

The protection layer 26 has a thickness of 0.5 to 10 nm, for example. A Ta layer or an Ru layer may be used as the protection layer 26. The protection layer 26 may have a two-layer structure made up of a combination of layers such as a Ta layer and an Ru layer, or a three-layer structure made up of a combination of a Ta layer, an Ru layer and a Ta layer or a combination of an Ru layer, a Ta layer and an Ru layer, for example.

A method of manufacturing the MR element 5 of the embodiment includes the steps of respectively forming the underlying layer 21, the antiferromagnetic layer 22, the pinned layer 23, the spacer layer 24, the free layer 25, and the protection layer 26 in this order on the first shield layer 3 by sputtering, for example.

The operation of the thin-film magnetic head of the embodiment will now be described. The thin-film magnetic head writes data on a recording medium by using the write head and reads data written on the recording medium by using the read head.

In the read head, the direction of the bias magnetic field created by the bias field applying layers 6 intersects the direction orthogonal to the medium facing surface 20 at a right angle. In the MR element 5 the direction of magnetization of the free layer 25 is aligned with the direction of the bias magnetic field when no signal magnetic field exists. The direction of magnetization of the pinned layer 23 is fixed to the direction orthogonal to the medium facing surface 20.

In the MR element 5, the direction of magnetization of the free layer 25 changes in response to the signal magnetic field sent from the recording medium. This causes a change in the relative angle between the direction of magnetization of the free layer 25 and the direction of magnetization of the pinned layer 23, and as a result, the resistance of the MR element 5 changes. The resistance of the MR element 5 can be determined from the potential difference between the first and second shield layers 3 and 8 produced when a sense current is fed to the MR element 5 from the shield layers 3 and 8. Thus, it is possible for the read head to read data stored on the recording medium.

The features of the exchange-coupling film 30 and the MR element 5 of the embodiment will now be described. The exchange-coupling film 30 of the embodiment incorporates the antiferromagnetic layer 22 and the pinned layer 23 that are stacked. The direction of magnetization of the pinned layer 23 is fixed. The pinned layer 23 includes the first layer 311, the second layer 312, the third layer 313, the nonmagnetic middle layer 32 and the inner layer 33 that are disposed in this order, the first layer 311 being closest to the antiferromagnetic layer 22.

The first layer 311 is made of a ferromagnetic material and has a face-centered cubic structure. The second layer 312 is made of only iron or an alloy containing x atomic % cobalt and (100−x) atomic % iron, wherein x is greater than zero and smaller than or equal to 60. The second layer 312 has a body-centered cubic structure. The third layer 313 is made of an alloy containing y atomic % cobalt and (100−y) atomic % iron, wherein y is within a range of 65 to 80 inclusive. The nonmagnetic middle layer 32 is made of a nonmagnetic material. The inner layer 33 is made of a ferromagnetic material. The antiferromagnetic layer 22 and the first layer 311 are exchange-coupled to each other. The third layer 313 and the inner layer 33 are antiferromagnetically coupled to each other.

In the exchange-coupling film 30 of the embodiment, the second layer 312 is preferably made of an alloy containing x atomic % cobalt and (100−x) atomic % iron, wherein x is within a range of 30 to 60 inclusive.

The MR element 5 of the embodiment incorporates: the exchange-coupling film 30 described above; the spacer layer 24 disposed at such a position that the pinned layer 23 is sandwiched between the spacer layer 24 and the antiferromagnetic layer 22; and the free layer 25 that is disposed at such a position that the spacer layer 24 is sandwiching between the free layer 25 and the pinned layer 23 and that has a direction of magnetization that changes in response to an external magnetic field.

Table 1 below shows the materials of the layers constituting the exchange-coupling film 30 of the first embodiment and the materials of layers constituting an exchange-coupling film of a reference example in contrast to each other. Here, the exchange-coupling film of the reference example is one of examples of the exchange-coupling film disclosed in JP 2004-103806A. The materials of the antiferromagnetic layer 22, the first layer 311, the nonmagnetic middle layer 32 and the inner layer 33 of the exchange-coupling film 30 of the first embodiment shown on Table 1 are given by way of example. A CoFe alloy containing M atomic % cobalt (Co) and N atomic % iron (Fe) is hereinafter indicated as $Co_M Fe_N$.

TABLE 1

| | | Reference example | First embodiment |
|---|---|---|---|
| | Inner layer | CoFe | CoFe |
| | Nonmagnetic middle layer | Ru | Ru |
| Outer layer | Third layer | $Co_{90}Fe_{10}$ | $Co_y Fe_{(100-y)}$ ($65 \leq y \leq 80$) |
| | Second layer | $Co_{50}Fe_{50}$ | $Co_x Fe_{(100-x)}$ ($0 < x \leq 60$) |
| | First layer | $Co_{90}Fe_{10}$ | $Co_{90}Fe_{10}$ |
| | Antiferromagnetic layer | IrMn | IrMn |

According to the exchange-coupling film 30, the MR element 5 and the thin-film magnetic head of the embodiment, as will be indicated by results of experiments shown later, it is possible to enhance both the exchange coupling between the antiferromagnetic layer 22 and the first layer 311 and the antiferromagnetic coupling between the third layer 313 and the inner layer 33. It is thereby possible to increase the exchange-coupling magnetic field of the pinned layer 23.

In the embodiment, the first layer 311 has a face-centered cubic structure. This is a requirement for enhancing the exchange coupling between the antiferromagnetic layer 22 and the pinned layer 23 and thereby increasing the exchange-coupling magnetic field of the pinned layer 23, as disclosed in JP 2004-103806A. The composition range of the material of the second layer 312 and that of the third layer 313 listed above are each determined for increasing the exchange-coupling magnetic field of the pinned layer 23 based on the results of first to third experiments described below.

Figure 8:
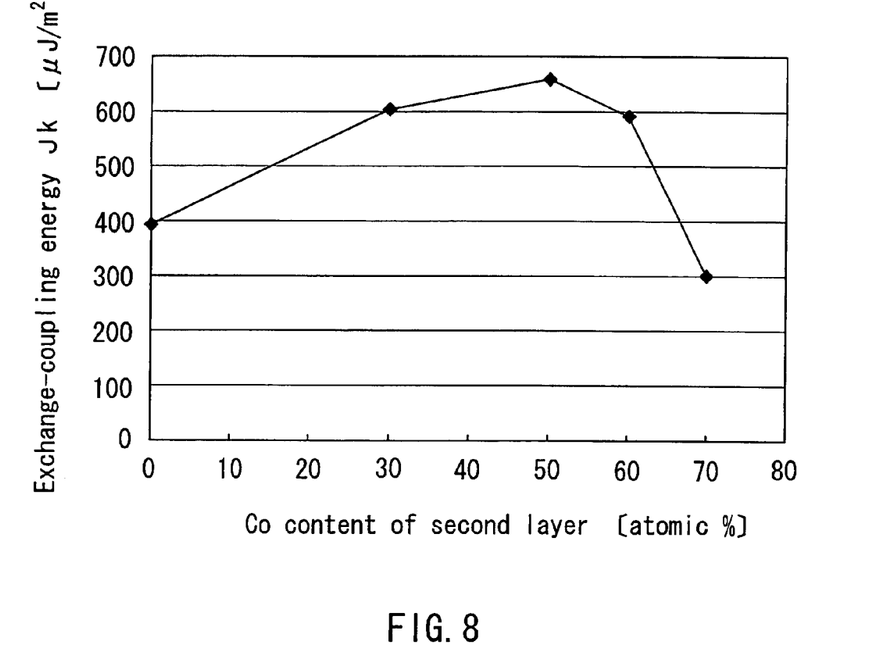
FIG. 8 is a plot showing results of a first experiment on the first embodiment of the invention.

The first experiment was performed to determine a desirable composition range of the material of the second layer 312. In the first experiment, samples 11 to 15 described below were first prepared. Each of the samples 11 to 15 is a layered film formed by stacking the first layer 311, the second layer 312 and the third layer 313 in this order on the antiferromagnetic layer 22. The samples 11 to 15 are different in the material of the second layer 312 only. In each of the samples 11 to 15, the antiferromagnetic layer 22 is a 7 nm-thick layer of IrMn, and each of the first layer 311 and the third layer 313 is a 0.5 nm-thick layer of $Co_{90}Fe_{10}$. In each of the samples 11 to 15, the second layer 312 is 3 nm thick. In the first experiment, the exchange-coupling energy Jk ($\mu J/m^2$) of each of the samples 11 to 15 was determined. Table 2 below and FIG. 8 show the results of the first experiment. Table 2 lists the composition of the second layer 312 and the exchange-coupling energy Jk of each of the samples 11 to 15. FIG. 8 shows the relationship between the exchange-coupling energy Jk and the Co content (atomic %) of the second layer 312.

TABLE 2

| Sample | Composition of second layer | Jk ($\mu J/m^2$) |
|---|---|---|
| 11 | Fe | 392 |
| 12 | $Co_{30}Fe_{70}$ | 605 |
| 13 | $Co_{50}Fe_{50}$ | 662 |
| 14 | $Co_{60}Fe_{40}$ | 594 |
| 15 | $Co_{70}Fe_{30}$ | 301 |

FIG. 8 indicates that the exchange-coupling energy Jk is high where the Co content of the second layer 312 is in the range of 0 to 60 atomic % inclusive, particularly in the range of 30 to 60 atomic % inclusive. None of the samples 11 to 15 of the first experiment have the nonmagnetic middle layer 32 and the inner layer 33. Therefore, it is assumed that the reason why the exchange-coupling energy Jk is high in the above-mentioned composition range of the second layer 312 is that the exchange coupling between the antiferromagnetic layer 22 and the first layer 311 is of great magnitude in this composition range of the second layer 312.

The results of the first experiment teach that, to enhance the exchange coupling between the antiferromagnetic layer 22 and the first layer 311, it is desirable that the Co content of the second layer 312 be in the range of 0 to 60 atomic % inclusive, preferably in the range of 30 to 60 atomic % inclusive. Based on this finding from the first experiment, it is defined in the embodiment that the second layer 312 is made of only iron or an alloy containing x atomic % cobalt and (100−x) atomic % iron, wherein x is greater than zero and smaller than or equal to 60. The second layer 312 made of a material in this composition range has a body-centered cubic structure. To enhance the exchange coupling between the antiferromagnetic layer 22 and the first layer 311, it is preferred that the second layer 312 be made of an alloy containing x atomic % cobalt and (100−x) atomic % iron, wherein x is within a range of 30 to 60 inclusive.

Figure 9:
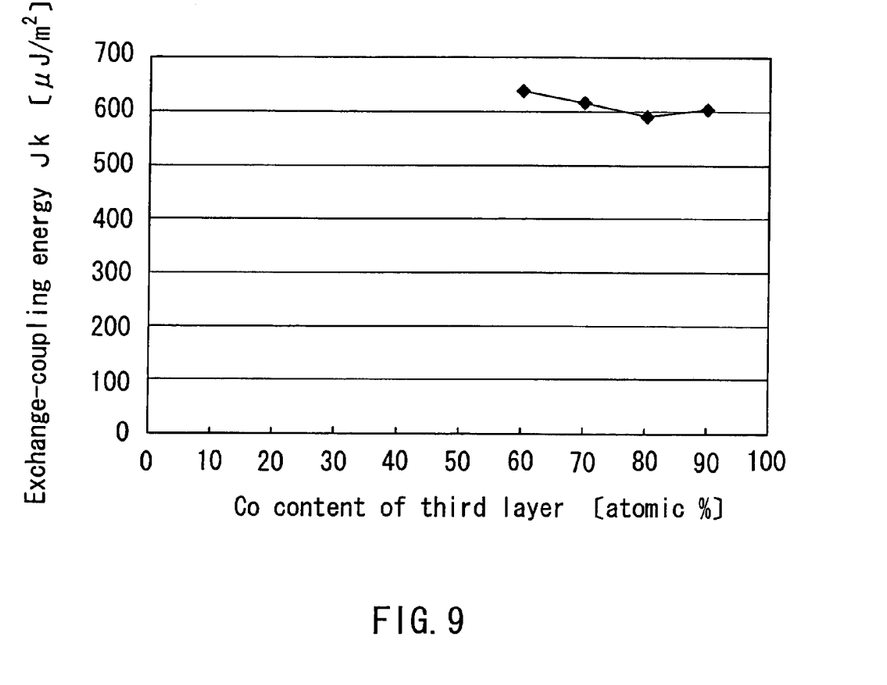
FIG. 9 is a plot showing results of a second experiment on the first embodiment of the invention.

The second experiment was performed to study whether the composition of the third layer 313 has an influence on the magnitude of the exchange coupling between the antiferromagnetic layer 22 and the first layer 311. In the second experiment, samples 21 to 24 described below were first prepared. Each of the samples 21 to 24 is a layered film formed by stacking the first layer 311, the second layer 312 and the third layer 313 in this order on the antiferromagnetic layer 22. The samples 21 to 24 are different in the material of the third layer 313 only. In each of the samples 21 to 24, the antiferromagnetic layer 22 is a 7 nm-thick layer of IrMn, the first layer 311 is a 0.5 nm-thick layer of $Co_{90}Fe_{10}$, and the second layer 312 is a 3 nm-thick layer of $Co_{30}Fe_{70}$. In each of the samples 21 to 24, the third layer 313 is 0.5 nm thick. In the second experiment, the exchange-coupling energy Jk ($\mu J/m^2$) of each of the samples 21 to 24 was determined. Table 3 below and FIG. 9 show the results of the second experiment. Table 3 lists the composition of the third layer 313 and the exchange-coupling energy Jk of each of the samples 21 to 24. FIG. 9 shows the relationship between the exchange-coupling energy Jk and the Co content (atomic %) of the third layer 313.

TABLE 3

| Sample | Composition of third layer | Jk ($\mu J/m^2$) |
| --- | --- | --- |
| 21 | $Co_{90}Fe_{10}$ | 605 |
| 22 | $Co_{80}Fe_{20}$ | 593 |
| 23 | $Co_{70}Fe_{30}$ | 617 |
| 24 | $Co_{60}Fe_{40}$ | 639 |

Table 3 and FIG. 9 teach that there are no great differences in the exchange-coupling energy Jk even if the third layers 313 have different compositions. Therefore, the results of the second experiment indicate that the composition of the third layer 313 has little influence on the magnitude of the exchange coupling between the antiferromagnetic layer 22 and the first layer 311.

Figure 10:
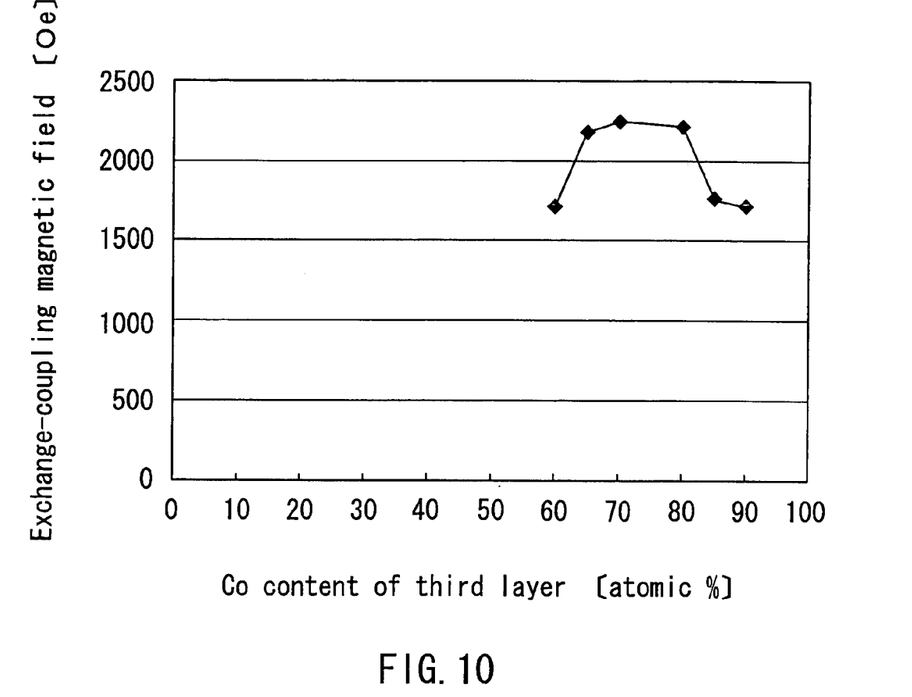
FIG. 10 is a plot showing results of a third experiment on the first embodiment of the invention.

The third experiment was performed to determine a desirable composition range of the third layer 313 to enhance the antiferromagnetic coupling between the third layer 313 and the inner layer 33. In the third experiment, samples 31 to 36 described below were first prepared. Each of the samples 31 to 36 is a layered film formed by stacking the first layer 311, the second layer 312, the third layer 313, the nonmagnetic middle layer 32 and the inner layer 33 in this order on the antiferromagnetic layer 22. The samples 31 to 36 are different in the material of the third layer 313 only. In each of the samples 31 to 36, the antiferromagnetic layer 22 is a 7 nm-thick layer of IrMn, the first layer 311 is a 0.5 nm-thick layer of $Co_{90}Fe_{10}$, and the second layer 312 is a 3 nm-thick layer of $CO_{30}Fe_{70}$. In each of the samples 31 to 36, the third layer 313 is 0.5 nm thick. In each of the samples 31 to 36, the nonmagnetic middle layer 32 is a 0.8 nm-thick layer of Ru, and the inner layer 33 is a 3 nm-thick layer of $CO_{70}Fe_{30}$. In the third experiment, the exchange-coupling magnetic field Hex (Oe) (1 Oe=79.6 A/m) of each of the samples 31 to 36 was determined. Table 4 below and FIG. 10 show the results of the third experiment. Table 4 lists the composition of the third layer 313 and the exchange-coupling magnetic field Hex (Oe) of each of the samples 31 to 36. FIG. 10 shows the relationship between the exchange-coupling magnetic field Hex (Oe) and the Co content (atomic %) of the third layer 313.

TABLE 4

| Sample | Composition of third layer | Hex (Oe) |
| --- | --- | --- |
| 31 | $Co_{90}Fe_{10}$ | 1721 |
| 32 | $Co_{85}Fe_{15}$ | 1770 |
| 33 | $Co_{80}Fe_{20}$ | 2218 |
| 34 | $Co_{70}Fe_{30}$ | 2250 |
| 35 | $Co_{65}Fe_{35}$ | 2184 |
| 36 | $Co_{60}Fe_{40}$ | 1714 |

FIG. 10 indicates that the exchange-coupling magnetic field Hex is great where the Co content of the third layer 313 is in the range of 65 to 80 atomic % inclusive. Since the second experiment has shown that the composition of the third layer 313 has little influence on the magnitude of the exchange coupling between the antiferromagnetic layer 22 and the first layer 311, it is assumed that the reason why the exchange-coupling magnetic field Hex is great in the above-mentioned composition range of the third layer 313 is that the antiferromagnetic coupling between the third layer 313 and the inner layer 33 is of great magnitude in this composition range of the third layer 313.

The results of the third experiment teach that, to enhance the antiferromagnetic coupling between the third layer 313 and the inner layer 33, it is desirable that the Co content of the third layer 313 be in the range of 65 to 80 atomic % inclusive. Based on this finding from the third experiment, it is defined in the embodiment that the third layer 313 is made of an alloy containing y atomic % cobalt and (100−y) atomic % iron, wherein y is within the range of 65 to 80 inclusive.

According to the embodiment, as seen from the foregoing results of the experiments, it is possible to enhance both the exchange coupling between the antiferromagnetic layer 22 and the first layer 311, and the antiferromagnetic coupling between the third layer 313 and the inner layer 33. It is thereby possible to increase the exchange-coupling magnetic field of the pinned layer 23.

Figure 4:
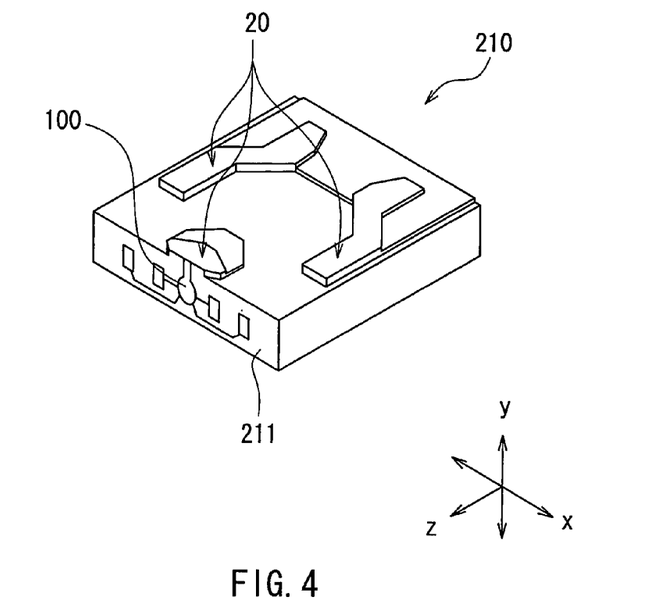
FIG. 4 is a perspective view illustrating a slider that a head gimbal assembly of the first embodiment of the invention includes.

A head gimbal assembly, a head arm assembly and a magnetic disk drive of the embodiment will now be described. Reference is made to FIG. 4 to describe a slider 210 incorporated in the head gimbal assembly. In the magnetic disk drive the slider 210 is placed to face toward a magnetic disk platter that is a circular-plate-shaped recording medium to be driven to rotate. The slider 210 has a base body 211 made up mainly of the substrate 1 and the overcoat layer 17 of FIG. 2. The base body 211 is nearly hexahedron-shaped. One of the six surfaces of the base body 211 faces toward the magnetic disk platter. The medium facing surface 20 is formed in this one of the surfaces. When the magnetic disk platter rotates in the z direction of FIG. 4, an airflow passes between the magnetic disk platter and the slider 210, and a lift is thereby generated below the slider 210 in the y direction of FIG. 4 and exerted on the slider 210. The slider 210 flies over the surface of the magnetic disk platter by means of the lift. The x direction of FIG. 4 is across the tracks of the magnetic disk platter. The thin-film magnetic head 100 of the embodiment is formed near the air-outflow-side end (the end located at the lower left of FIG. 4) of the slider 210.

Figure 5:
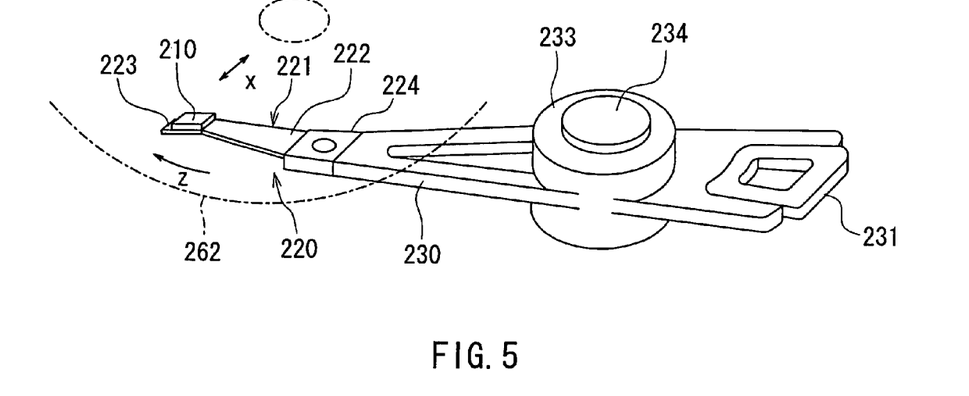
FIG. 5 is a perspective view illustrating a head arm assembly of the first embodiment of the invention.

Reference is now made to FIG. 5 to describe the head gimbal assembly 220 of the embodiment. The head gimbal assembly 220 comprises the slider 210 and a suspension 221 that flexibly supports the slider 210. The suspension 221 incorporates: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator incorporates the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly comprising the arm 230 and the head gimbal assembly 220 attached to the arm 230 is called a head arm assembly. An assembly comprising a carriage having a plurality of arms wherein the head gimbal assembly 220 is attached to each of the arms is called a head stack assembly.

FIG. 5 illustrates the head arm assembly of the embodiment. In the head arm assembly the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 6:
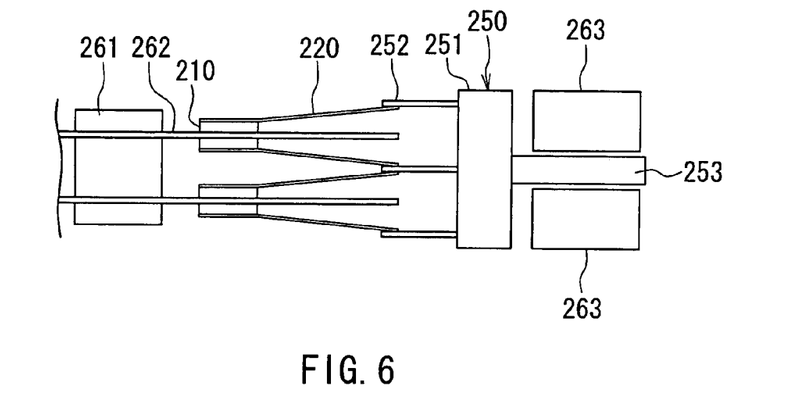
FIG. 6 is a view for illustrating a main part of a magnetic disk drive of the first embodiment of the invention.
Figure 7:
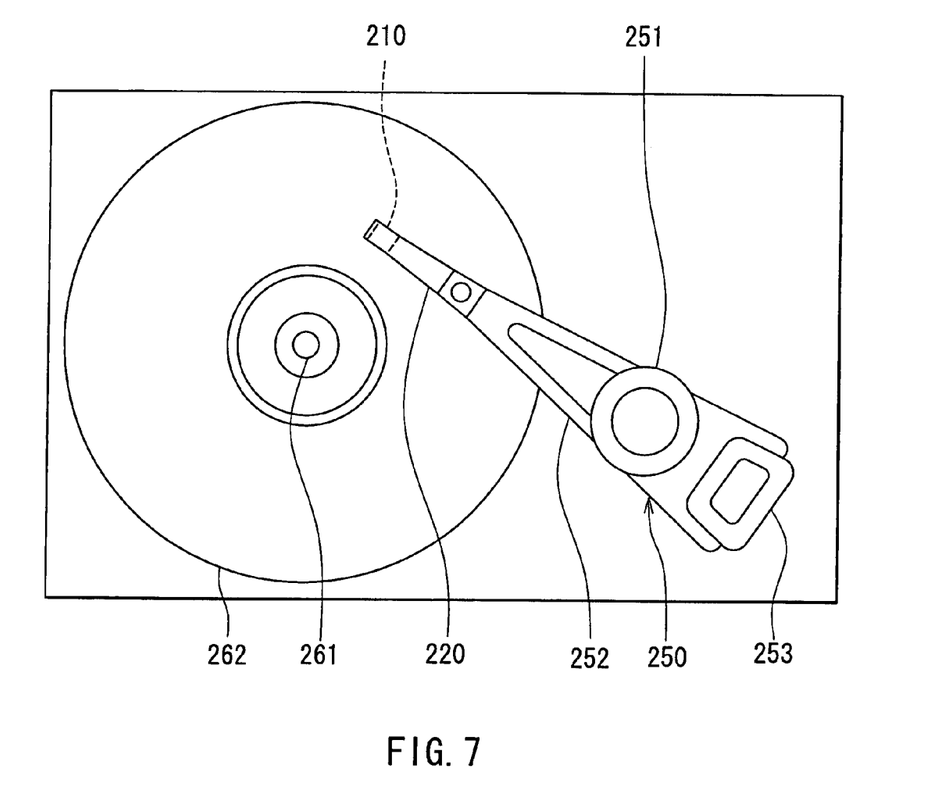
FIG. 7 is a top view of the magnetic disk drive of the first embodiment of the invention.

Reference is now made to FIG. 6 and FIG. 7 to describe an example of the head stack assembly and the magnetic disk drive of the embodiment. FIG. 6 illustrates the main part of the magnetic disk drive. FIG. 7 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263.

The actuator and the head stack assembly 250 except the sliders 210 correspond to the alignment device of the invention and support the sliders 210 and align them with respect to the magnetic disk platters 262.

In the magnetic disk drive of the embodiment the actuator moves the slider 210 across the tracks of the magnetic disk platter 262 and aligns the slider 210 with respect to the magnetic disk platter 262. The magnetic head incorporated in the slider 210 writes data on the magnetic disk platter 262 through the use of the write head and reads data stored on the magnetic disk platter 262 through the use of the read head.

The head gimbal assembly, the head arm assembly and the magnetic disk drive of the embodiment exhibit effects similar to those of the foregoing thin-film magnetic head of the embodiment.

Second Embodiment

Figure 11:
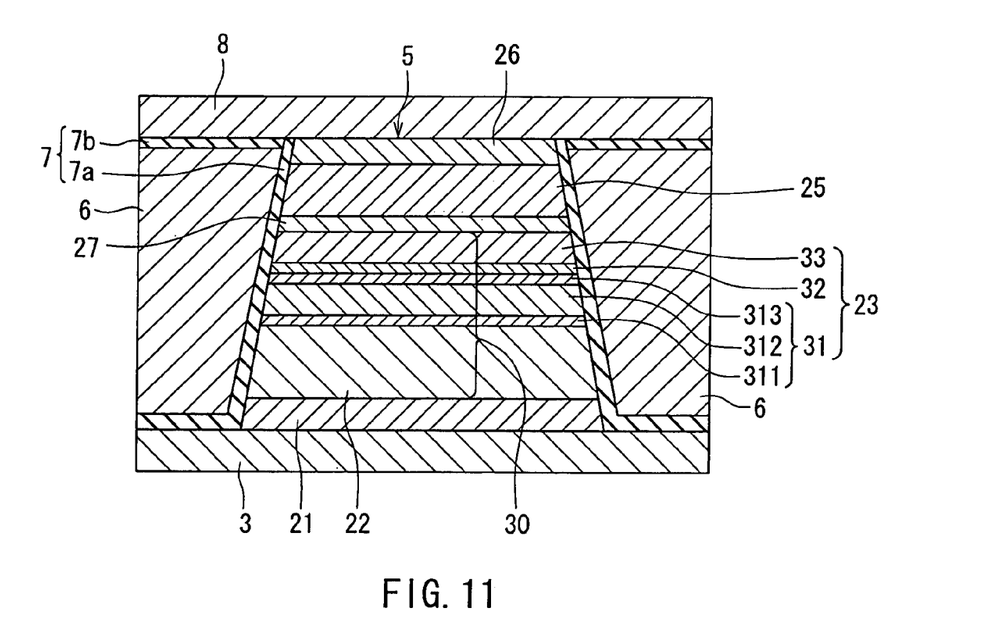
FIG. 11 is a cross-sectional view illustrating a cross section of a read head of a second embodiment of the invention, the cross section being parallel to the medium facing surface.

A second embodiment of the invention will now be described. FIG. 11 is a cross-sectional view illustrating a cross section of a read head of the second embodiment, the cross section being parallel to the medium facing surface. As shown in FIG. 11, the MR element 5 of the second embodiment has a configuration in which a spacer layer 27 made of a nonmagnetic conductive layer is provided in place of the spacer layer 24 of the first embodiment. That is, the MR element 5 of the second embodiment is a CPP-GMR element. The spacer layer 27 has a thickness of 1.0 to 4.0 nm, for example. The spacer layer 27 is made of a nonmagnetic conductive material containing at least one element selected from the group consisting of Cu, Au and Ag, for example, wherein the proportion of the element is 80 weight % or higher.

In the second embodiment, as in the first embodiment, a sense current is fed to the MR element 5 in a direction intersecting the plane of each layer making up the MR element 5, such as the direction perpendicular to the plane of each layer making up the MR element 5. The remainder of configuration, operation and effects of the second embodiment are similar to those of the first embodiment.

Third Embodiment

Figure 12:
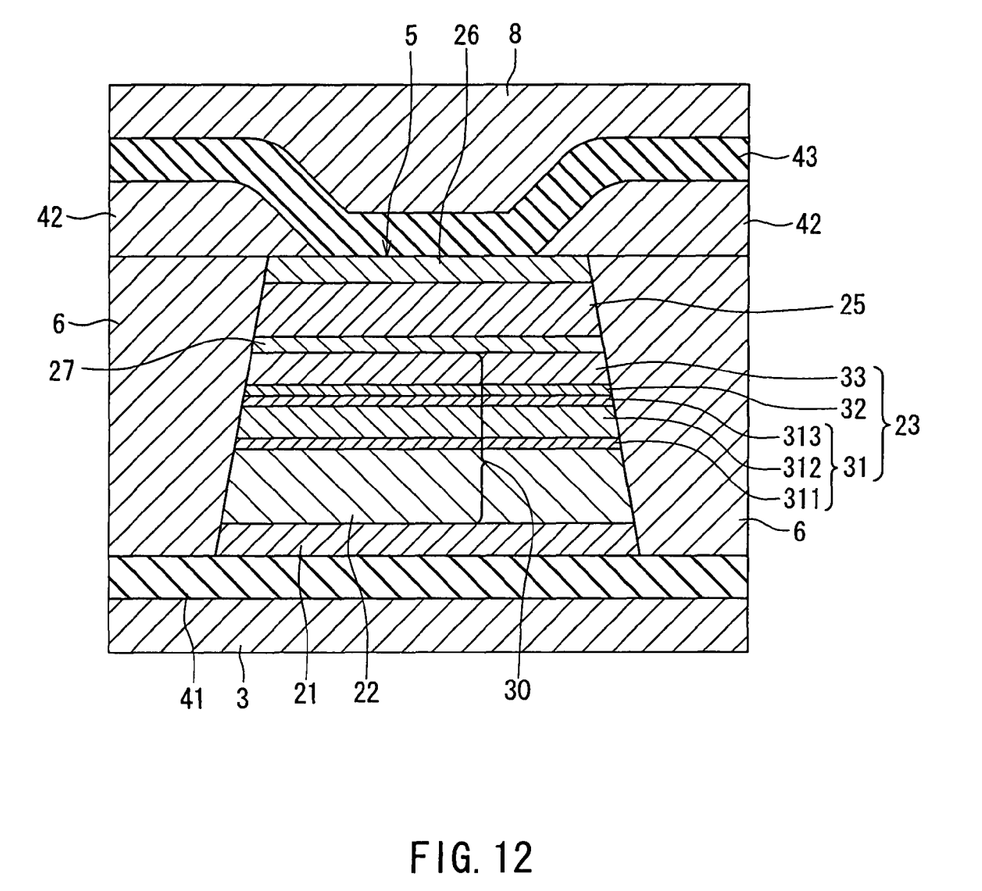
FIG. 12 is a cross-sectional view illustrating a cross section of a read head of a third embodiment of the invention, the cross section being parallel to the medium facing surface.

A third embodiment of the invention will now be described. FIG. 12 is a cross-sectional view illustrating a cross section of a read head of the third embodiment, the cross section being parallel to the medium facing surface. As shown in FIG. 12, the MR element 5 of the third embodiment has a configuration in which the spacer layer 27 made of a nonmagnetic conductive layer is provided in place of the spacer layer 24 of the first embodiment, as does the MR element 5 of the second embodiment. The thickness and the material of the spacer layer 27 are the same as those of the second embodiment.

In the third embodiment, a first shield gap film 41 made of an insulating film is provided on the first shield layer 3. The MR element 5 is disposed on the first shield gap film 41. In the third embodiment the insulating layer 7 of the first embodiment is not provided, and the two bias field applying layers 6 respectively touch the two sides of the MR element 5. There are provided two electrode layers 42 made of a conductive material on the two bias field applying layers 6. The two electrode layers 42 may overlap the protection layer 26 as shown in FIG. 12, but it is not necessary that the two electrode layers 42 overlap the protection layer 26. In the third embodiment a second shield gap film 43 made of an insulating film is provided to cover the two electrode layers 42 and the MR element 5. The second shield layer 8 is disposed on the second shield gap film 43.

In the third embodiment, a sense current is fed by the two electrode layers 42 to the MR element 5 in the direction parallel to the plane of each layer making up the MR element 5. That is, the MR element 5 of the third embodiment is a CIP-GMR element. The remainder of configuration, operation and effects of the third embodiment are similar to those of the first embodiment.

The present invention is not limited to the foregoing embodiments but may be practiced in still other ways. For example, in the embodiments, while the thin-film magnetic head disclosed in the first embodiment has such a configuration that the read head is formed on the base body and the write head is stacked on the read head, it is also possible that the read head is stacked on the write head.

If the thin-film magnetic head is to be used only for read operations, the thin-film magnetic head may have a configuration incorporating a read head only.

The magnetoresistive element of the invention is not only applicable to the read head of a thin-film magnetic head but to other applications such as magnetic sensors.

Obviously many modifications and variations of the present invention are possible in the light of the above teachings. It is therefore to be understood that within the scope of the appended claims the invention may be practiced otherwise than as specifically described.

What is claimed is:

1. An exchange-coupling film comprising an antiferromagnetic layer and a pinned layer that are stacked, the pinned layer having a fixed direction of magnetization, wherein:
the pinned layer includes a first ferromagnetic layer, a second ferromagnetic layer, a third ferromagnetic layer, a nonmagnetic middle layer, and a fourth ferromagnetic layer that are disposed in this order, the first ferromagnetic layer being closest to the antiferromagnetic layer;
the first ferromagnetic layer is made of a ferromagnetic material and has a face-centered cubic structure;
the second ferromagnetic layer is made of only iron or an alloy containing x atomic % cobalt and (100−x) atomic % iron, wherein x is greater than zero and smaller than or equal to 60;
the third ferromagnetic layer is made of an alloy containing y atomic % cobalt and (100−y) atomic % iron, wherein y is within a range of 65 to 80 inclusive;
the nonmagnetic middle layer is made of a nonmagnetic material;
the fourth ferromagnetic layer is made of a ferromagnetic material;
the antiferromagnetic layer and the first ferromagnetic layer are exchange-coupled to each other; and
the third and fourth ferromagnetic layers are antiferromagnetically coupled to each other.

2. The exchange-coupling film according to claim 1, wherein the second ferromagnetic layer has a body-centered cubic structure.

3. The exchange-coupling film according to claim 1, wherein the second ferromagnetic layer is made of an alloy containing x atomic % cobalt and (100−x) atomic % iron, wherein x is within a range of 30 to 60 inclusive.

4. A magnetoresistive element comprising:
an exchange-coupling film incorporating an antiferromagnetic layer and a pinned layer that are stacked, the pinned layer having a fixed direction of magnetization;
a spacer layer made of a nonmagnetic material and disposed at such a position that the pinned layer is sandwiched between the spacer layer and the antiferromagnetic layer; and
a free layer disposed at such a position that the spacer layer is sandwiched between the free layer and the pinned layer, the free layer having a direction of magnetization that changes in response to an external magnetic field, wherein:
the pinned layer includes a first ferromagnetic layer, a second ferromagnetic layer, a third ferromagnetic layer, a nonmagnetic middle layer, and a fourth ferromagnetic layer that are disposed in this order, the first ferromagnetic layer being closest to the antiferromagnetic layer;
the first ferromagnetic layer is made of a ferromagnetic material and has a face-centered cubic structure;
the second ferromagnetic layer is made of only iron or an alloy containing x atomic % cobalt and (100−x) atomic % iron, wherein x is greater than zero and smaller than or equal to 60;
the third ferromagnetic layer is made of an alloy containing y atomic % cobalt and (100−y) atomic % iron, wherein y is within a range of 65 to 80 inclusive;
the nonmagnetic middle layer is made of a nonmagnetic material;
the fourth ferromagnetic layer is made of a ferromagnetic material;
the antiferromagnetic layer and the first ferromagnetic layer are exchange-coupled to each other; and
the third and fourth ferromagnetic layers are antiferromagnetically coupled to each other.

5. A thin-film magnetic head comprising: a medium facing surface that faces toward a recording medium; and a magnetoresistive element disposed near the medium facing surface for detecting a signal magnetic field sent from the recording medium,
the magnetoresistive element comprising:
an exchange-coupling film incorporating an antiferromagnetic layer and a pinned layer that are stacked, the pinned layer having a fixed direction of magnetization;
a spacer layer made of a nonmagnetic material and disposed at such a position that the pinned layer is sandwiched between the spacer layer and the antiferromagnetic layer; and
a free layer disposed at such a position that the spacer layer is sandwiched between the free layer and the pinned layer, the free layer having a direction of magnetization that changes in response to an external magnetic field, wherein:
the pinned layer includes a first ferromagnetic layer, a second ferromagnetic layer, a third ferromagnetic layer, a nonmagnetic middle layer, and a fourth ferromagnetic layer that are disposed in this order, the first ferromagnetic layer being closest to the antiferromagnetic layer;
the first ferromagnetic layer is made of a ferromagnetic material and has a face-centered cubic structure;
the second ferromagnetic layer is made of only iron or an alloy containing x atomic % cobalt and (100−x) atomic % iron, wherein x is greater than zero and smaller than or equal to 60;
the third ferromagnetic layer is made of an alloy containing y atomic % cobalt and (100−y) atomic % iron, wherein y is within a range of 65 to 80 inclusive;
the nonmagnetic middle layer is made of a nonmagnetic material;
the fourth ferromagnetic layer is made of a ferromagnetic material;
the antiferromagnetic layer and the first ferromagnetic layer are exchange-coupled to each other; and
the third and fourth ferromagnetic layers are antiferromagnetically coupled to each other.

6. A head gimbal assembly comprising: a slider including a thin-film magnetic head and disposed to face toward a recording medium; and a suspension flexibly supporting the slider,
the thin-film magnetic head comprising: a medium facing surface that faces toward the recording medium; and a magnetoresistive element disposed near the medium facing surface for detecting a signal magnetic field sent from the recording medium, the magnetoresistive element comprising:

an exchange-coupling film incorporating an antiferromagnetic layer and a pinned layer that are stacked, the pinned layer having a fixed direction of magnetization;

a spacer layer made of a nonmagnetic material and disposed at such a position that the pinned layer is sandwiched between the spacer layer and the antiferromagnetic layer; and a free layer disposed at such a position that the spacer layer is sandwiched between the free layer and the pinned layer, the free layer having a direction of magnetization that changes in response to an external magnetic field, wherein:

the pinned layer includes a first ferromagnetic layer, a second ferromagnetic layer, a third ferromagnetic layer, a nonmagnetic middle layer, and a fourth ferromagnetic layer that are disposed in this order, the first ferromagnetic layer being closest to the antiferromagnetic layer;

the first ferromagnetic layer is made of a ferromagnetic material and has a face-centered cubic structure;

the second ferromagnetic layer is made of only iron or an alloy containing x atomic % cobalt and (100−x) atomic % iron, wherein x is greater than zero and smaller than or equal to 60;

the third ferromagnetic layer is made of an alloy containing y atomic % cobalt and (100−y) atomic % iron, wherein y is within a range of 65 to 80 inclusive;

the nonmagnetic middle layer is made of a nonmagnetic material;

the fourth ferromagnetic layer is made of a ferromagnetic material;

the antiferromagnetic layer and the first ferromagnetic layer are exchange-coupled to each other; and the third and fourth ferromagnetic layers are antiferromagnetically coupled to each other.

7. A head arm assembly comprising: a slider including a thin-film magnetic head and disposed to face toward a recording medium; a suspension flexibly supporting the slider; and an arm for making the slider travel across tracks of the recording medium, the suspension being attached to the arm, the thin-film magnetic head comprising: a medium facing surface that faces toward the recording medium; and a magnetoresistive element disposed near the medium facing surface for detecting a signal magnetic field sent from the recording medium, the magnetoresistive element comprising:

an exchange-coupling film incorporating an antiferromagnetic layer and a pinned layer that are stacked, the pinned layer having a fixed direction of magnetization;

a spacer layer made of a nonmagnetic material and disposed at such a position that the pinned layer is sandwiched between the spacer layer and the antiferromagnetic layer; and a free layer disposed at such a position that the spacer layer is sandwiched between the free layer and the pinned layer, the free layer having a direction of magnetization that changes in response to an external magnetic field, wherein:

the pinned layer includes a first ferromagnetic layer, a second ferromagnetic layer, a third ferromagnetic layer, a nonmagnetic middle layer, and a fourth ferromagnetic layer that are disposed in this order, the first ferromagnetic layer being closest to the antiferromagnetic layer;

the first ferromagnetic layer is made of a ferromagnetic material and has a face-centered cubic structure;

the second ferromagnetic layer is made of only iron or an alloy containing x atomic % cobalt and (100−x) atomic % iron, wherein x is greater than zero and smaller than or equal to 60;

the third ferromagnetic layer is made of an alloy containing y atomic % cobalt and (100−y) atomic % iron, wherein y is within a range of 65 to 80 inclusive;

the nonmagnetic middle layer is made of a nonmagnetic material;

the fourth ferromagnetic layer is made of a ferromagnetic material;

the antiferromagnetic layer and the first ferromagnetic layer are exchange-coupled to each other; and the third and fourth ferromagnetic layers are antiferromagnetically coupled to each other.

8. A magnetic disk drive comprising: a slider including a thin-film magnetic head and disposed to face toward a recording medium that is driven to rotate; and an alignment device supporting the slider and aligning the slider with respect to the recording medium, the thin-film magnetic head comprising: a medium facing surface that faces toward the recording medium; and a magnetoresistive element disposed near the medium facing surface for detecting a signal magnetic field sent from the recording medium, the magnetoresistive element comprising:

an exchange-coupling film incorporating an antiferromagnetic layer and a pinned layer that are stacked, the pinned layer having a fixed direction of magnetization;

a spacer layer made of a nonmagnetic material and disposed at such a position that the pinned layer is sandwiched between the spacer layer and the antiferromagnetic layer; and a free layer disposed at such a position that the spacer layer is sandwiched between the free layer and the pinned layer, the free layer having a direction of magnetization that changes in response to an external magnetic field, wherein:

the pinned layer includes a first ferromagnetic layer, a second ferromagnetic layer, a third ferromagnetic layer, a nonmagnetic middle layer, and a fourth ferromagnetic layer that are disposed in this order, the first ferromagnetic layer being closest to the antiferromagnetic layer;

the first ferromagnetic layer is made of a ferromagnetic material and has a face-centered cubic structure;

the second ferromagnetic layer is made of only iron or an alloy containing x atomic % cobalt and (100−x) atomic % iron, wherein x is greater than zero and smaller than or equal to 60;

the third ferromagnetic layer is made of an alloy containing y atomic % cobalt and (100−y) atomic % iron, wherein y is within a range of 65 to 80 inclusive;

the nonmagnetic middle layer is made of a nonmagnetic material;

the fourth ferromagnetic layer is made of a ferromagnetic material;

the antiferromagnetic layer and the first ferromagnetic layer are exchange-coupled to each other; and the third and fourth ferromagnetic layers are antiferromagnetically coupled to each other.

* * * * *